United States Patent [19]
Gardner et al.

[11] Patent Number: 6,100,204
[45] Date of Patent: Aug. 8, 2000

[54] METHOD OF MAKING ULTRA THIN GATE OXIDE USING ALUMINUM OXIDE

[75] Inventors: Mark I. Gardner, Cedar Creek; Mark C. Gilmer, Austin; Thomas E. Spikes, Jr., Round Rock, all of Tex.

[73] Assignee: Advanced Micro Devices, Inc., Sunnyvale, Calif.

[21] Appl. No.: 09/123,657

[22] Filed: Jul. 28, 1998

[51] Int. Cl.$^7$ .................................................. H01L 21/469
[52] U.S. Cl. ............................................................ 438/765
[58] Field of Search ................................... 438/305, 306, 438/307, 301, 765, 585, 591

[56] References Cited

U.S. PATENT DOCUMENTS

| | | | |
|---|---|---|---|
| 5,858,843 | 1/1999 | Dolle et al. | 438/299 |
| 5,872,387 | 2/1999 | Lyding et al. | 257/607 |
| 5,985,706 | 11/1999 | Gilmer et al. | 438/199 |

OTHER PUBLICATIONS

Stanley Wolf and Richard N. Tauber; *Silicon Processing for the VLSI Era*, vol. 1—Process Technology; pp. 514–519; 1986.

Stanley Wolf and Richard N. Tauber; *Silicon Processing for the VLSI Era*, vol. 2—Process Integration; pp. 434–435; 1990.

Stanley Wolf and Richard N. Tauber; *Silicon Processing for the VLSI Era*, vol. 3–The Submicron MOSFET; pp. 422–438; 1995.

*Primary Examiner*—David Nelms
*Assistant Examiner*—Dung A Le
*Attorney, Agent, or Firm*—Timothy M. Honeycutt

[57] ABSTRACT

A transistor and a method of making the same are provided. The method includes the step of forming a gate dielectric layer on the substrate where the gate dielectric layer is composed of an aluminum oxide containing material. A gate electrode is formed on the gate dielectric layer and first and second source/drain regions are formed in the substrate laterally separated to define a channel region beneath the gate electrode. The aluminum oxide containing material may be, for example, $Al_2O_3$. Aluminum oxide provides for a gate dielectric with a thin equivalent thickness of oxide in a potentially single crystal form.

18 Claims, 2 Drawing Sheets

6,100,204

METHOD OF MAKING ULTRA THIN GATE OXIDE USING ALUMINUM OXIDE

BACKGROUND OF THE INVENTION

1. Field of the Invention

This invention relates generally to semiconductor processing, and more particularly, to a transistor with an aluminum oxide containing gate dielectric layer, and to a method of making the same.

2. Description of the Related Art

A conventional field effect transistor implemented in silicon typically consists of a source and a drain formed in a silicon substrate, and separated laterally to define a channel region in the substrate. A gate dielectric layer is positioned on the substrate over the channel region and a gate electrode composed of a conducting material, such as aluminum or doped polysilicon, is disposed on the gate dielectric layer. The gate electrode is designed to emit an electric field into the channel region. Changes in the electric field emitted by the gate electrode enable, or alternatively, disable the flow of current between the source and the drain.

In a conventional process flow for forming a typical field effect transistor, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The gate electrode acts as a hard mask against the implant so that the source and drain are formed in the substrate self-aligned to the gate electrode. Many conventional semiconductor fabrication processes employ a double implant process to form the source and drain. The first implant is performed self-aligned to the gate electrode to establish lightly doped drain ("LDD") structures. After the LDD implant, dielectric sidewall spacers are formed adjacent to the gate electrode by depositing and anisotropically etching a dielectric material, such as silicon dioxide. The second of the two source/drain implants is then performed self-aligned to the sidewall spacers. The substrate is then annealed to activate the dopant in the source and the drain. Salicidation steps frequently follow the formation of the source and drain.

The gate dielectric formation aspects of conventional transistor fabrication present certain disadvantages. Silicon dioxide gate oxide layers are made as thin as possible to maximize drive current and to control short channel effects. The requirement for very thin gate oxide layers has become particularly important in sub-micron processing where process scaling has dramatically increased the potential for short channel effects. However, the scaling of silicon dioxide gate dielectric layers has introduced another set of problems. To begin with, very thin silicon dioxide layers have been historically difficult to fabricate with a consistent thickness across a given wafer, from wafer to wafer and from lot to lot. In addition, as the thickness of silicon dioxide is scaled downward, the potential for reliability problems associated with dielectric breakdown and hot and cold carrier injection degradation increases. Hot and cold carrier degradation can significantly reduce device performance, while dielectric breakdown can lead to complete device failure.

One potential cause of carrier injection and potential dielectric breakdown is thought to occur as a result of interface traps near the Si—$SiO_2$ interface. Interface traps are the apparent result of dangling silicon bonds at the Si—$SiO_2$ interface. Dangling Si bonds represent sites where hot carrier injection, Fowler-Nordheim tunneling and direct tunneling can occur. Although tunneling is thought to arise as a natural consequence of the quantum mechanical nature of electrons positioned near a very thin oxide layer, dangling Si bonds appear to exacerbate the problem. Independent of the exact physical cause of carrier injection, the empirical result for very thin oxides may be gate leakage currents and/or catastrophic device failure.

Another difficulty associated with very thin conventional gate oxides is polysilicon depletion. In p-channel transistors, the source and drain are commonly formed in the substrate by implanting a p-type dopant, such as boron. The implant also deposits boron into the polysilicon of the gate electrode. Subsequent thermal processing steps to fabricate a conventional p-channel field effect transistor frequently cause boron to diffuse from the gate electrode through the gate oxide layer and into the channel region. If the amount of boron diffused is sufficiently high, the electrical performance of the field effect transistor may be severely degraded due to polysilicon depletion. The potential for boron diffusion increases with decreasing oxide thickness.

The present invention is directed to overcoming or reducing the effects of one or more of the foregoing disadvantages.

SUMMARY OF THE INVENTION

In accordance with one aspect of the present invention, a method of fabricating a transistor is provided. The method includes the step of forming a gate dielectric layer on the substrate where the gate dielectric layer is composed of an aluminum oxide containing material. A gate electrode is formed on the gate dielectric layer and first and second source/drain regions are formed in the substrate laterally separated to define a channel region beneath the gate electrode.

In accordance with another aspect of the present invention, a method of fabricating a transistor on a substrate is provided. The method includes the steps of forming a gate dielectric layer on the substrate where the gate dielectric layer is composed of $Al_2O_3$. A gate electrode is formed on the gate dielectric layer. First and second source/drain regions are formed in the substrate laterally separated to define a channel region beneath the gate electrode.

In accordance with another aspect of the present invention, a transistor is provided that includes a substrate and a gate dielectric layer on the substrate and that is composed of an aluminum oxide containing material. A gate electrode is on the gate dielectric layer and first and second source/drain regions are in the substrate and separated laterally to define a channel region beneath the gate electrode.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
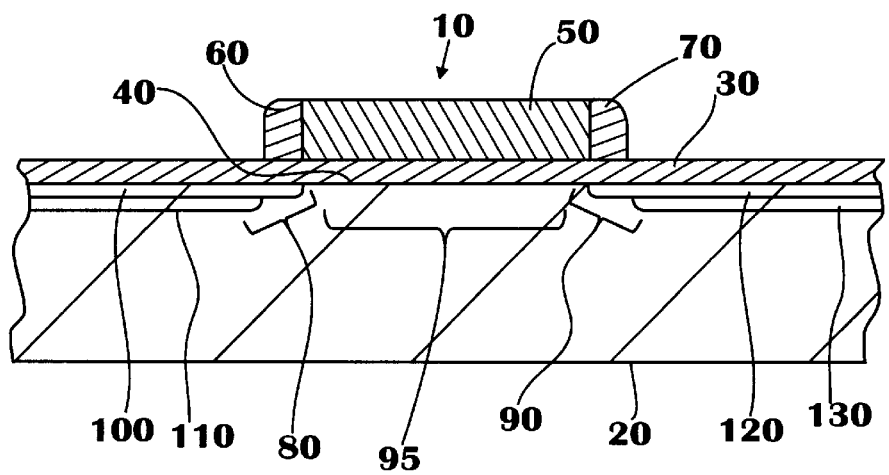
FIG. 1 is a cross-sectional view of an exemplary embodiment of a transistor in accordance with the present invention.

In the drawings described below, reference numerals are generally repeated where identical elements appear in more than one figure. Turning now to the drawings, and in particular to FIG. 1, there is shown a cross-sectional view of an exemplary embodiment of a transistor 10 that is formed on a semiconductor substrate 20. The semiconductor substrate 20 may be composed of n-doped, or p-doped silicon, silicon-on-insulator, or other suitable substrate materials. The transistor 10 includes an insulating or gate dielectric layer 30 that is formed on the upper surface 40 of the substrate 20 and a gate electrode 50 that is formed on the first insulating layer 30. Dielectric sidewall spacers 60 and 70 are positioned adjacent the gate electrode 50. Source/drain regions 80 and 90 are formed in the substrate 20 and laterally separated to define a channel region 95 beneath the gate electrode 50. The source/drain region 80 includes a lightly doped drain ("LDD") region 100 and a partially overlapping heavier doped region 110. The source/drain region 90 is provided with identical LDD and heavier doped regions 120 and 130. The phrase "source/drain region(s)" is used herein to describe a region that may serve as either a source or a drain. The skilled artisan will appreciate that a source/drain region may function as a source or a drain depending upon whether it is connected to $V_{SS}$ or $V_{DD}$ during metallization.

The gate dielectric layer 30 is advantageously composed of a material with a higher dielectric constant ("K") than conventional gate oxide ($SiO_2$) that may be readily formed on the upper surface 40 of the substrate 20 in single crystal form or with just a few crystals. In an exemplary embodiment, the material is an aluminum oxide containing material, such as aluminum oxide ($Al_2O_3$), silicate ($Al_2O_3.SiO_2$ or $3Al_2O_3.2SiO_2$) or the like. Such materials enable the layer 30 to be formed with a thickness that not only provides desirable resistance to carrier injection, but also a desirably thin equivalent thickness of oxide ($t_{ox}$).

Figure 2:
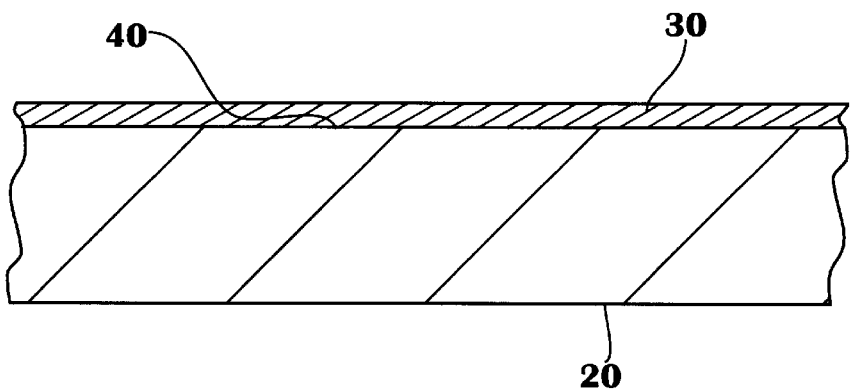
FIG. 2 is a cross-sectional view depicting formation of an aluminum oxide containing gate dielectric layer on a substrate in accordance with the present invention.

An exemplary process flow for forming the transistor 10 may be understood by referring now to FIGS. 2, 3, 4 and 5, and initially to FIG. 2. The process will be described in the context of an n-channel device. However, the skilled artisan will appreciate that the transistor 10 may be implemented as n-channel, p-channel or another type of device. Prior to formation of the gate dielectric layer 30, the upper surface 40 of the substrate 20 should be inspected, and cleaned as necessary to remove film and particulate contaminants. Surface contaminants may not only interfere with the adhesion of the later-formed layer 30, but may also provide multiple seeds for crystal formation during application of the layer 30. A multiplicity of seed sites may cause the layer 30 to form with a polycrystalline, rather than the desired single crystal structure. Film removal may be by well known RCA cleaning techniques. Particulate removal may be by ultrasonic scrubbing, high pressure spray and brush scrubbing or like techniques. The particulate removal may be integrated into the RCA cleaning if desired.

Following cleaning, the gate dielectric layer 30 is formed on the substrate 20. As noted above, the layer 30 is advantageously composed of $Al_2O_3$ or an $Al_2O_3$ containing material. With a K≅10 (versus K≅4 for $SiO_2$), an $Al_2O_3$ layer 30 presents advantages over conventional gate oxide. The much larger permissible thickness of the $Al_2O_3$ layer 30 translates into better resistance to boron penetration and to tunneling caused by quantum mechanical effects, without sacrificing the equivalent $t_{ox}$ of the layer 30. The layer 30 may be about 30 to 80 Å thick and is advantageously about 40 Å thick. This thickness range translates into an equivalent $t_{ox}$ of about 12 to about 32 Å and an advantageous $t_{ox}$ of about 16 Å. In an exemplary embodiment, the gate dielectric layer 30 is $Al_2O_3$ grown on the substrate 20 by exposing the substrate 20 to an ambient containing $AlCl_3$ and $O_2$ at about 500 to 900° C. for about 60 to 90 seconds in a rapid thermal anneal process ("RTA") or for about 2 to 10 minutes in a furnace process. The process advantageously yields $Al_2O_3$ in single crystal form or consisting of a few crystals. The concentrations of the $AlCl_3$ and $O_2$ may be varied to achieve a desired growth rate and are largely a matter of design discretion. For example, the ambient may contain about 50 % $AlCl_3$ and about 50 % $O_2$. The reaction rate may also be modified as desired by introducing an inert gate into the ambient, such as argon, helium or the like. In lieu of reacting aluminum chloride in oxygen, chemical vapor deposition ("CVD") or like deposition techniques may be used to deposit $Al_2O_3$.

The mathematical relationship between the targeted equivalent $t_{ox}$ for the layer 30 and the actual thickness of the $Al_2O_3$ layer 30 is given by the following equation:

$$\frac{K_{Al_2O_3}}{K_{SiO_2}} \cdot (\text{Equivalent } t_{ox}) \cong (\text{Thickness of } Al_2O_3 \text{ Layer}) \qquad \text{Equation 1}$$

where $K_{Al2O3}$ and $K_{SiO2}$ are the dielectric constants for $Al_2O_3$ and $SiO_2$. Note that the equation is expressed as an approximation since $Al_2O_3$ and $SiO_2$ have a range of dielectric constants instead of a single value.

If another material, such as $Al_2O_3.SiO_2$, is selected, the same general regimen may be used to achieve the same thin equivalent $t_{ox}$. The requisite thickness of the layer 30 of $Al_2O_3.SiO_2$ or other material layer will be given by the above equation when the appropriate K value for $Al_2O_3.SiO_2$ is substituted.

The formation of the layer 30 is carried out at lower temperatures (e.g. about 500 to 900° C.) than conventional $SiO_2$ gate oxide processing, which is normally performed at 800 to 1100° C. Accordingly, the process of the present invention preserves thermal budget that may be utilized elsewhere in the process flow.

Figure 3:
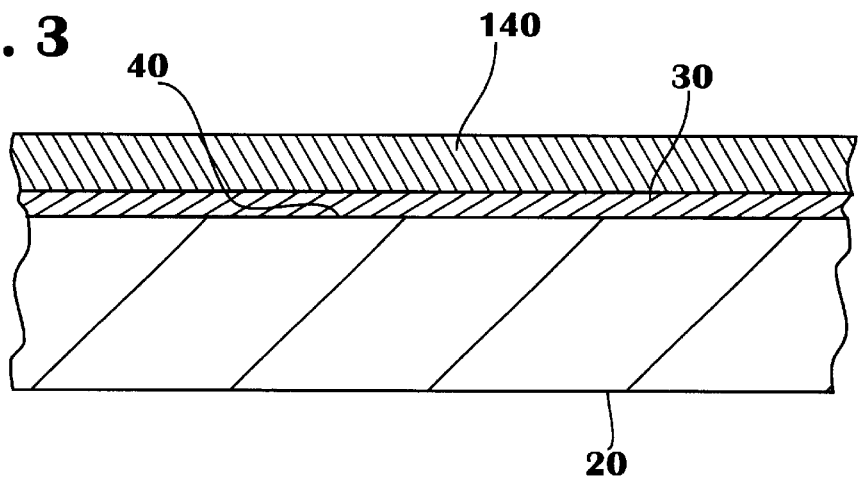
FIG. 3 is a cross-sectional view like FIG. 2 depicting formation of a conducting layer in accordance with the present invention.
Figure 4:
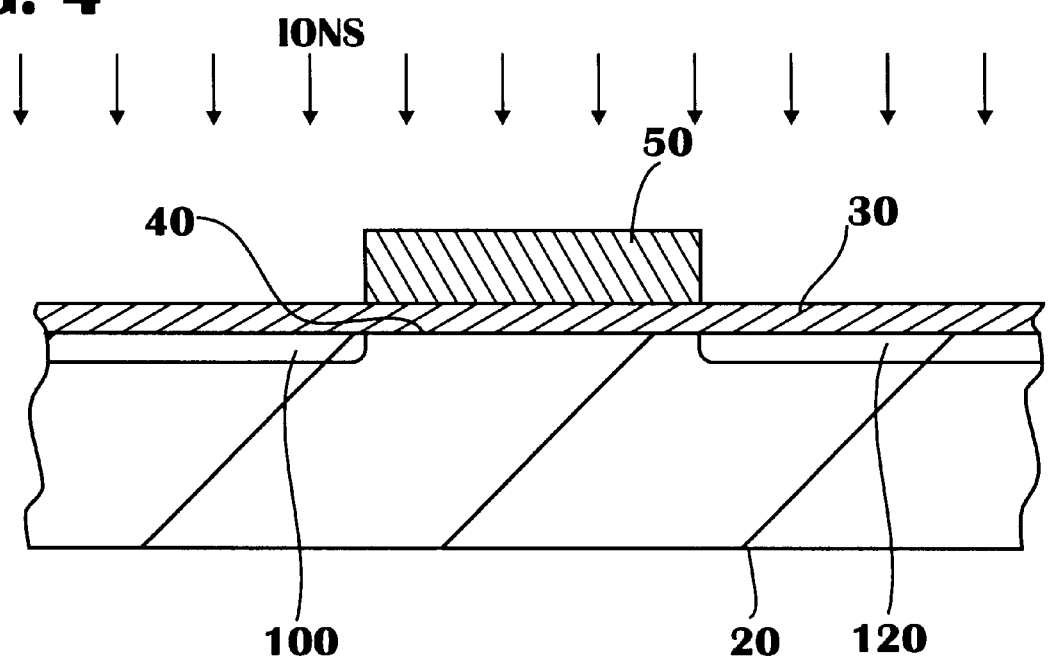
FIG. 4 is a cross-sectional view depicting definition of a gate electrode and formation of lightly doped drain regions in the substrate in accordance with the present invention.

Referring now to FIGS. 3 and 4, the gate electrode 50 is fabricated by initially depositing a layer 140 of conducting material on the layer 30. The layer 140 may be composed of a variety of conducting materials, such as, for example, polysilicon, amorphous silicon, aluminum, tantalun or the like. In an exemplary embodiment, the layer 140 is polysilicon. Well known techniques for applying polysilicon, such as CVD, may be used to deposit the layer 140. In an exemplary embodiment, the polysilicon is deposited in situ after the layer 30 at or above about 625° C. to a thickness of about 750 to 1800 Å, and advantageously to about 1300 Å. Later implants for the source\drain regions 80 and 90 (see FIG. 1) will render the layer 40 conductive.

The layer 140 is masked and anisotropically etched to define the gate electrode 50. The poly etch will be selective to the $Al_2O_3$, so the portions of the layer 30 lateral to the gate 50 remain after the etch. The etch process may be by reactive ion etching, chemical plasma etching, or other like anisotropic etching techniques.

The LDD regions 30 and 34 are established in the substrate by ion implantation or diffusion as desired. In an exemplary embodiment, the LDD regions 30 and 34 are formed by implanting an n-type dopant, such as arsenic. The particular energy and dosage of the implant(s) will depend upon the dopant type. The dosage may be about 5E13 to 8E14 ions/cm$^2$ and is advantageously about 4E14 ions/cm$^2$. The energy may be about 5 to 30 keV and is advantageously about 20 keV. The implant angle is advantageously 0°.

Figure 5:
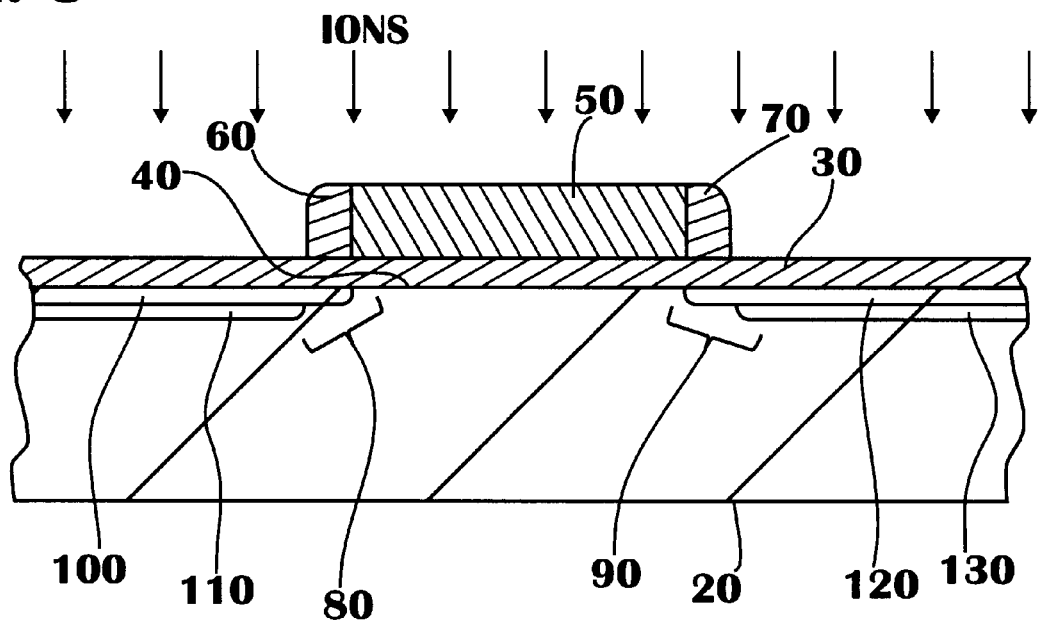
FIG. 5 is a cross-sectional view like FIG. 4 depicting formation of heavier doped regions in the substrate in accordance with the present invention.

Referring now to FIG. 5, the dielectric sidewall spacers 18 and 20 are formed on the gate dielectric layer 30 adjacent the gate electrode 50, and the heavier doped regions 32 and 36 are established by ion implantation self-aligned to the spacers 60 and 70 as shown. The process used to form the spacers 60 and 70 will depend upon the material selected. For example, if silicon dioxide is selected, the spacers 60 and 70 may be established by CVD of silicon dioxide followed by an anisotropic etch of the deposited oxide that removes the unwanted portions of the layers 60 and 70. CVD may also be used where silicon nitride is selected as the sidewall material. The etch should be selective to the Al$_2$O$_3$.

The energy and dosage for the implant to establish the regions 32 and 36 will depend upon the dopant specie. In an exemplary embodiment, arsenic may be implanted with a dosage of about 2E15 to 7E15 ions/cm$^2$ and advantageously about 4E15 ions/cm$^2$, and an energy of about 5 to 30 keV and advantageously about 20 keV. The implant angle may be 0°.

The source/drain regions 80 and 90 have been described in the context of a LDD region combined with a heavier doped region. However, the skilled artisan will appreciate that a single implant, a multiple implant or a diffusion process may be used.

Activation of the source/drain regions 80 and 90 may coincide with one or more of the various high temperature steps that normally accompany metallization. However, the source/drain regions 80 and 90 may be annealed at this stage, if desired. For example, the anneal may be a RTA at about 900 to 1075° C. for about 30 to 60 seconds, and in an inert ambient of argon, helium, nitrogen or other inert gas. The lateral separation of the source/drain regions 80 and 90 defines the channel region 95 beneath the gate dielectric layer 30 and the gate electrode 50. The skilled artisan will appreciate that the boundaries of the channel region 95 may migrate during later high temperature steps.

The process in accordance with the present invention yields a transistor that integrates a high K gate dielectric with a corresponding relatively thin equivalent $t_{ox}$. Formation of the Al$_2$O$_3$ gate dielectric layer consumes much less thermal budget than conventional oxide. The single crystal Al$_2$O$_3$ gate dielectric thus formed exhibits excellent electrical properties and resistance to hot and cold carrier degradation.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a transistor, comprising the steps of:

forming a gate dielectric layer of an aluminum oxide containing material on the substrate by exposing the substrate to an ambient containing aluminum chloride and oxygen;

forming a gate electrode on the gate dielectric layer; and forming first and second source/drain regions in the substrate laterally separated to define a channel region beneath the gate electrode.

2. The method of claim 1, wherein the ambient contains about 50% aluminum chloride.

3. The method of claim 1, wherein the ambient contains an inert gas.

4. The method of claim 3, wherein the inert gas is N$_2$, argon, or helium.

5. The method of claim 1, wherein the substrate is exposed to the aluminum chloride and oxygen ambient at about 500 to 900° C. for about 60 to 90 seconds.

6. The method of claim 1, wherein the substrate is exposed to the aluminum chloride and oxygen ambient at about 500 to 900° C. for about 2 to 10 minutes.

7. The method of claim 1, wherein the step of forming the gate electrode comprises depositing a layer of polysilicon and etching the layer of polysilicon to define the gate electrode.

8. The method of claim 1, comprising the step of forming first and second sidewall spacers adjacent the gate electrode.

9. The method of claim 8, wherein the step of forming the first and second source/drain regions comprises performing a first implant of a dopant specie into the substrate prior to formation of the first and second sidewall spacers and a second implant of the dopant specie into the substrate following formation of the first and second sidewall spacers.

10. A method of fabricating a transistor, comprising the steps of:

forming a gate dielectric layer of Al$_2$O$_3$ on the substrate by exposing the substrate to an ambient containing aluminum chloride and oxygen;

forming a gate electrode on the gate dielectric layer; and forming first and second source/drain regions in the substrate laterally separated to define a channel region beneath the gate electrode.

11. The method of claim 10, wherein the ambient contains about 50% aluminum chloride and about 50% oxygen.

12. The method of claim 10, wherein the ambient contains an inert gas.

13. The method of claim 12, wherein the inert gas is N$_2$, argon, or helium.

14. The method of claim 10, wherein the substrate is exposed to the aluminum chloride and oxygen ambient at about 500 to 900° C. for about 60 to 90 seconds.

15. The method of claim 10, wherein the substrate is exposed to the aluminum chloride and oxygen ambient at about 500 to 900° C. for about 2 to 10 minutes.

16. The method of claim 10, wherein the step of forming the gate electrode comprises depositing a layer of polysilicon and etching the layer of polysilicon to define the gate electrode.

17. The method of claim 10, comprising the step of forming first and second sidewall spacers adjacent the gate electrode.

18. The method of claim 17, wherein the step of forming the first and second source/drain regions comprises performing a first implant of a dopant specie into the substrate prior to formation of the first and second sidewall spacers and a second implant of the dopant specie into the substrate following formation of the first and second sidewall spacers.

* * * * *

UNITED STATES PATENT AND TRADEMARK OFFICE
CERTIFICATE OF CORRECTION

PATENT NO. : 6,100,204
DATED : August 8, 2000
INVENTOR(S) : Mark I. Gardner et al.

It is certified that error appears in the above-identified patent and that said Letters Patent is hereby corrected as shown below:

Claim 1,
After the phrase "containing material on" delete the word "the" and substitute the word -- a -- therefor;

Claim 2,
After the word "chloride" insert the phrase -- and about 50% oxygen --; and Claim 10,
After the phrase "layer of $Al_2O_3$ on" delete the word "the" and substitute the word -- a -- therefor.

Signed and Sealed this

Twenty-third Day of October, 2001

Attest:

*Nicholas P. Godici*

NICHOLAS P. GODICI
*Attesting Officer*     *Acting Director of the United States Patent and Trademark Office*